(12) United States Patent
Linde

(10) Patent No.: US 10,144,180 B2
(45) Date of Patent: Dec. 4, 2018

(54) WELDING SYSTEM

(71) Applicant: Airbus Operations GmbH, Hamburg (DE)

(72) Inventor: Peter Linde, Hamburg (DE)

(73) Assignee: Airbus Operations GmbH, Hamburg (DE)

(*) Notice: Subject to any disclaimer, the term of this patent is extended or adjusted under 35 U.S.C. 154(b) by 159 days.

(21) Appl. No.: 15/386,518

(22) Filed: Dec. 21, 2016

(65) Prior Publication Data
US 2017/0173864 A1 Jun. 22, 2017

(30) Foreign Application Priority Data
Dec. 21, 2015 (EP) ..................................... 15201774

(51) Int. Cl.
*B29C 65/00* (2006.01)
*B29C 65/16* (2006.01)
(Continued)

(52) U.S. Cl.
CPC ............ *B29C 66/836* (2013.01); *B29C 65/16* (2013.01); *B29C 65/1658* (2013.01); *B29C 65/1664* (2013.01); *B29C 66/112* (2013.01); *B29C 66/131* (2013.01); *B29C 66/474* (2013.01); *B29C 66/524* (2013.01);
(Continued)

(58) Field of Classification Search
CPC ... B29C 66/836; B29C 66/122; B29C 66/131; B29C 66/474; B29C 66/524; B29C 66/73921; B29C 66/81262; B29C 66/81267; B29C 66/8244; B29C 66/8362; B29C 66/8432; B29C 66/87; B29C 66/924; B29C 65/16; B29C 65/1658; B29C 65/1664; B32B 27/08; B32B 37/0046; B32B 37/06; B32B 38/0008; H01L 39/00; H02N 15/04
See application file for complete search history.

(56) References Cited

U.S. PATENT DOCUMENTS

| | | | |
|---|---|---|---|
| 5,631,617 A * | 5/1997 | Morishita | ............... B60L 13/10 104/285 |
| 5,753,068 A | 5/1998 | Mittleider | |
| 2014/0290866 A1 * | 10/2014 | Brufau Redondo | .. B29C 70/388 156/535 |

OTHER PUBLICATIONS

Extended European Search Report for Application No. 15201774 dated Jun. 10, 2016.

* cited by examiner

*Primary Examiner* — Daniel McNally
(74) *Attorney, Agent, or Firm* — Jenkins, Wilson, Taylor & Hunt, P.A.

(57) ABSTRACT

A system for welding an elongate element along a longitudinal direction to a component including a support element comprising a support surface, a magnetic field generating arrangement generating a predefined magnetic field, a carriage comprising contacts supporting an elongate element against movement along the surface of the component in directions perpendicular to the longitudinal direction, a superconducting element being fixedly connected to the carriage, an element cooling device for cooling the superconducting element below its transition temperature, a mover operable to linearly move the carriage, and a welding device for welding the elongate element to the component. The predefined magnetic field defines a linear path along the support surface for the superconducting element when the superconducting element has a temperature below its transition temperature.

13 Claims, 3 Drawing Sheets

(51) Int. Cl.
*B32B 27/08* (2006.01)
*B32B 37/00* (2006.01)
*B32B 37/06* (2006.01)
*B32B 38/00* (2006.01)
*H01L 39/00* (2006.01)
*H02N 15/04* (2006.01)
B29K 101/12 (2006.01)
B29L 31/30 (2006.01)
B29C 65/08 (2006.01)

(52) U.S. Cl.
CPC .. *B29C 66/73921* (2013.01); *B29C 66/81262* (2013.01); *B29C 66/81267* (2013.01); *B29C 66/81811* (2013.01); *B29C 66/8244* (2013.01); *B29C 66/8362* (2013.01); *B29C 66/8432* (2013.01); *B29C 66/87* (2013.01); *B29C 66/924* (2013.01); *B32B 27/08* (2013.01); *B32B 37/0046* (2013.01); *B32B 37/06* (2013.01); *B32B 38/0008* (2013.01); *H01L 39/00* (2013.01); *H02N 15/04* (2013.01); B29C 65/08 (2013.01); B29C 65/1635 (2013.01); B29C 66/721 (2013.01); B29C 66/8122 (2013.01); B29K 2101/12 (2013.01); B29L 2031/3076 (2013.01); B32B 2250/02 (2013.01); B32B 2398/20 (2013.01); B32B 2605/18 (2013.01)

WELDING SYSTEM

CROSS-REFERENCE TO RELATED APPLICATION

This application claims priority to European Patent Application No. 15201774.5 filed Dec. 21, 2015, the entire disclosure of which is incorporated herein by reference.

TECHNICAL FIELD

The disclosure herein relates to a system for welding an elongate element, such as a stiffening element, along a longitudinal direction thereof to a surface of a component, wherein the elongate element and the surface each comprise thermoplastic material.

BACKGROUND

In many areas of technology, such as in aircraft technology, it is necessary or desirable to secure an elongate element to a surface of a component at a defined relative position. One particular example is structural panels for aircraft. A known type of such structural panels is produced, e.g., by securing elongate stiffening elements, such as stringers, to a surface of a plate-shaped component or skin such that the longitudinal direction of the elongate stiffening element extends along the surface. For traditional aircraft having a metallic airframe the stiffening elements were typically secured to the skin by riveting. For aircraft built using composite materials welding techniques have also been considered.

In order to be able to efficiently secure an elongate element to a surface of a component by welding it must be ensured that the elongate element is reliably held in a fixed position on the surface while the employed welding tool or tools are moved along the elongate element.

SUMMARY

It is therefore an object of the present disclosure to provide a system for welding an elongate element to a surface of a component, wherein the system can fixedly position the elongate element with respect to the component, which system is simple to use.

This object is achieved by a system having features disclosed herein. Preferred embodiments of the system are disclosed herein.

According to the present disclosure a system for welding an elongate element along a longitudinal direction thereof to a surface of a component is provided. The elongate element and the surface each comprise thermoplastic material or consist of thermoplastic material, thereby allowing for simple and efficient welding. The elongate element may preferably be a stiffening element. For example, the stiffening element may be a stringer, such as an omega stringer or a J- or L-shaped stringer or other stiffening profile. The component is preferably plate-shaped and may be, e.g., a thermoplastic laminate or skin. In particular, the plate-shaped component and the elongate stiffening element may be secured to each other to form a structural panel for an aircraft.

The system comprises a support element, which is preferably plate-shaped and may be, e.g., a support table. The support element comprises a support surface adapted to support the component, i.e., a component of the above-described type, thereon. The system further comprises a magnetic field generating arrangement disposed on a side of the support element opposite the support surface and adapted to generate a predefined magnetic field above the support surface, i.e., on a side of the support element faced by the support surface. The magnetic field generating arrangement may comprise one or more permanent magnets and/or one or more electromagnets.

Moreover, the system comprises a carriage. The carriage is adapted to move in contact with the elongate element, i.e., an elongate element of the above type, along the longitudinal direction of the elongate element. The carriage comprises one or more first contact and one or more second contact. The one or more first contact(s) are spaced from the one or more second contact(s). Their arrangement and orientation is such that the one or more first contact and the one or more second contact are operable to contact the elongate element, which has a suitable cross-sectional shape and is placed on the surface of the component supported on the support element, at spaced locations and the elongate element is thereby supported against movement along the surface of the component—or preferably along the support surface—in directions perpendicular to the longitudinal direction of the elongate element. A suitable cross-sectional shape is determined by the arrangement of the first and second contacts, i.e., for any elongate element it can be determined based on the arrangement of the first and second contact elements whether the respective elongate element has a suitable cross-sectional shape to be contacted and supported by the first and second contacts in the manner described. Preferably the elongate element has a constant cross-sectional shape along its entire longitudinal length.

The arrangement and orientation of the one or more first contact and one or more second contact is further such that they allow movement of the carriage along the longitudinal direction of the elongate element while the first and second contacts are in contact with the elongate element in the manner described.

The system also comprises a superconducting element having a defined transition temperature below which the superconducting element exhibits superconductivity. The superconducting element is fixedly connected to the carriage, so that the carriage and the superconducting element have a fixed positional relationship and move together. The system comprises an element cooling device which is operable to cool the superconducting element below its transition temperature and maintain its temperature below the transition temperature. For example, the element cooling device may be a cryostat inside of which the superconducting element is disposed. Preferably, the element cooling device is fixedly secured to the carriage, and the superconducting element may then advantageously be fixedly connected to the carriage via the element cooling device.

The system further comprises a mover, such as, e.g., a linear motor, operable to move the carriage along a linear path, as well as one or more welding devices operable to weld the elongate element to the surface of the component. For example, the linear motor may comprise or be constituted by an arrangement of electromagnets and a controller adapted to control the electromagnets to effect linear movement of the carriage.

The predefined magnetic field generated in operation by the magnetic field generating arrangement is configured such that a linear path along the support surface at a distance above the support surface is defined for the superconducting element when the superconducting element has a temperature below its transition temperature. This definition of a linear path is due to the Meissner effect, which has as one consequence that a superconducting element cooled below its transition temperature may levitate in one or more fixed positions within a suitable magnetic field. In other words, a force is then exerted on the superconducting element by the magnetic field biasing the superconducting element towards the defined linear path. The mover is operable to move the carriage along a path corresponding to or determined by the defined linear path of the superconducting element.

Consequently, the magnetic field generating arrangement in fact constitutes or provides a "magnetic track" for the superconducting element and the carriage, so that, when the shape of the defined linear path corresponds to the shape of the longitudinal extension of the elongate element, the position of the elongate element on the surface of the component is fixedly maintained by the carriage during linear movement thereof. It is also advantageously possible to levitate the entire carriage such that only the one or more first contact and the one or more second contact and, possible, further selected contacts are in contact with the elongate element. Overall, an exact and automatic positioning of the elongate element by the carriage may therefore advantageously be achieved by the Meissner effect.

In a preferred embodiment the one or more first contact and the one or more second contact are arranged such that a reception space is defined between them. Then, when the elongate element has a suitable cross-sectional shape including a projecting portion extending along the longitudinal direction of the elongate element, the projecting portion is receivable in the reception space with the one or more first contact and the one or more second contact in contact with the projecting portion. The projecting portion projects in a direction away from the surface of the component and from the support surface. It is particularly preferred if the one or more first contact and the one or more second contact are arranged such that each of them is operable to apply a force to the projecting portion having a force component perpendicular to the support surface. In this manner the elongate element is may be pressed against the surface of the component to which it is to be welded, i.e., the Meissner effect is also advantageously utilized to create to clamp the elongate element between the carriage and the surface of the component.

In a preferred embodiment each of the one or more first contact and/or each of the one or more second contact comprises a rotatably mounted roller or ball. Such contacts advantageously provide for low frictional forces during movement of the carriage along the elongate element. However, each of these contacts may also be constituted by another type of contact element, such as a separate contact element mounted to a support arrangement, to which the superconducting element and the element cooling device are connected, or a portion of such support arrangement.

In a preferred embodiment each of the one or more first contact and/or each of the one or more second contact is mounted such that its position is adjustable and/or such that it is spring mounted to allow adaptation to various cross-sectional shapes of the elongate element. In this manner it is easily possible for the carriage to be actively adapted or to passively adapt to different elongate elements. In other words, the range of elongate elements suitable for the system is advantageously extended. Further spring mounted contacts provide the advantage of being able to compensate for tolerances and to be suitable for applying pressure to the elongate element in a particularly simple manner.

In a preferred embodiment the carriage comprises one or more third contact(s) which are arranged such that, when the elongate element has a suitable cross-sectional shape, the one or more third contact(s) are operable to contact the elongate element and to apply a force to the elongate element, such as, e.g., to a projecting portion thereof as mentioned above, having a force component perpendicular to the support surface. There may be two or more spaced sets of such one or more third contact. For example, there may be two sets, each for contacting another one of two opposite outer or foot portions of an omega stringer, which portions are in contact with the surface of the component.

In embodiments comprising one or more third contact, it is preferred if each of the one or more third contact comprises a rotatably mounted roller or ball. As in the case of the first and second contact, such third contact advantageously provide for low frictional forces during movement of the carriage along the elongate element. However, each of these third contacts may also be constituted by another type of contact element, such as a separate contact element mounted to a support arrangement, to which the superconducting element and the element cooling device are connected, or a portion of such support arrangement.

In embodiments comprising one or more third contact, it is also preferred if each of the one or more third contact is mounted such that its position is adjustable and/or such that it is spring mounted to allow adaptation to various cross-sectional shapes of the elongate element. In this manner it is easily possible for the carriage to be actively adapted or to passively adapt to different elongate elements. In other words, the range of elongate elements suitable for the system is advantageously extended. Further spring mounted third contact provide the advantage of being able to compensate for tolerances and to be suitable for applying pressure to the elongate element in a particularly simple manner.

In a preferred embodiment the one or more welding devices are provided on a welding unit, which is a component separate from the carriage. The welding unit and the carriage then comprise cooperating engagement or connectors operable to releasably couple the welding unit to the carriage. In the coupled condition the welding unit moves together with the carriage upon movement of the carriage. In this embodiment it is further preferred if the carriage is a positioning carriage and the welding unit comprises a welding unit carriage, wherein upon coupling the welding unit to the positioning carriage and moving the positioning carriage by the mover the welding unit carriage is pulled or pushed by the positioning carriage.

In a preferred embodiment one or more or all of the one or more welding devices is or are adapted to carry out laser welding, laser through welding, ultrasonic welding or induction welding. Laser through welding or laser transmission welding is particularly preferred, because it can be carried out with low energy consumption and does not require electric or magnetic circuits involving the parts to be welded to each other.

In a preferred embodiment the carriage or the one or more welding devices comprise at least one weld junction cooling device adapted to cool a weld junction created by the at least one welding device. Such a weld junction cooling device may comprise, e.g., one or more cooling pads. Cooling of the weld junction may be necessary when employing, e.g., laser welding and in particular laser through welding in order to weld portions of the component and the elongate element to each other having a thickness of more than about 1 mm. It is further preferred if the at least one weld junction cooling device is connected to the element cooling device and the element cooling device is adapted to cool the weld junction cooling device or assist in cooling the weld junction cooling device. For example, in case the element cooling device is or comprises a cryostat, an evaporation tube from the cryostat may be connected to the weld junction cooling device, such as a cooling pad.

BRIEF DESCRIPTION OF THE DRAWINGS

In the following an exemplary embodiment of a system for welding an elongated element to a surface of a component will be described in detail with reference to the schematic drawings, wherein.

DETAILED DESCRIPTION

Figure 1:
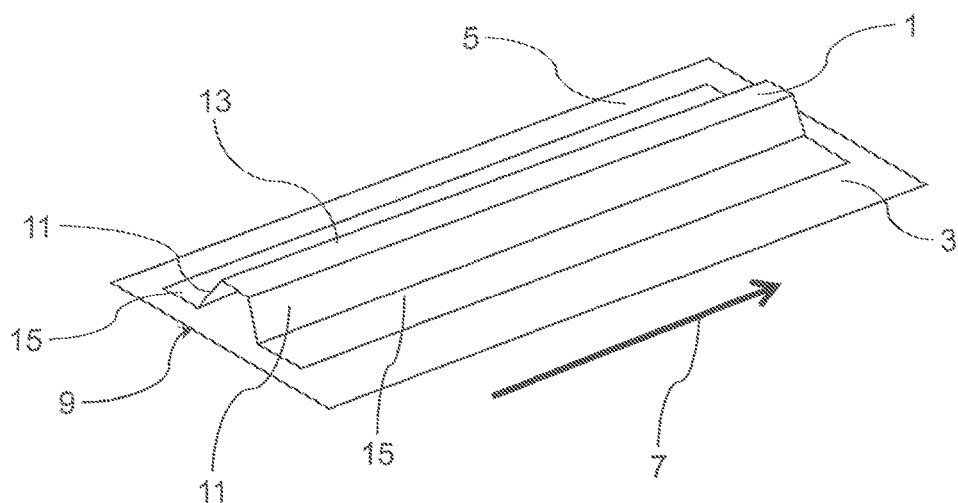
FIG. 1 shows a perspective view of an exemplary arrangement of a component and an elongate element to be welded to a surface of the component.

In FIG. 1 an elongate element 1 is arranged on a surface 3 of a component 5. The elongate element 1 is a stiffening element 1 in form of a stringer 1, in particular, an omega stringer 1. The component 5 is plate-shaped and can be part of a plastic laminate that forms, for example, part of a structural panel or the skin of a vehicle, e.g., an aircraft. Both the elongate element 1 and the surface 3 of the component 5 comprise thermoplastic material such that they can be welded. They can, for example, be made from a fiber reinforced thermoplastic material.

The elongate element 1 extends along a longitudinal direction 7, i.e., in the example shown in FIG. 1 the extension of the elongate element 1 in the longitudinal direction 7 exceeds its extension in any direction in a plane extending perpendicular to the longitudinal direction 7. In a plane extending perpendicular to the longitudinal direction 7 the elongate element 1 has a constant cross-sectional shape that includes a projecting portion 9 formed by two inclined leg portions 11 connected by a top portion 13. Each of the two inclined leg portions 11 merges into a foot portion 15. The foot portions 15 extend generally along the longitudinal direction 7 and in a plane extending parallel to the surface 3 of the component 5. The leg portions 11 are arranged inclined with respect to the surface 3 of the component 5, wherein the two portions 11 are inclined under opposing angles. The top portion 13 of the elongate element 1 extends parallel to the surface 3 of the component 5. Thus, a hollow space is formed between the leg portions 11, the top portion 13 and the surface 3 of the component 5. Overall, the cross-sectional shape of the elongate element 1 resembles a stylized Omega and has a mirror symmetric shape in a plane extending perpendicular to the longitudinal direction 7. The cross-sectional shape of the elongate element 1 is constant in the longitudinal direction 7.

In the arrangement shown in FIG. 1 the elongate element 1 has been placed onto the surface 3 of the component 5. In the region of the foot portions 15 the elongate element 1 is in planar contact with the surface 3 of the component 5 over extended regions. In at least parts of these extended regions the elongate element 1 shall be welded to the surface 3 of the component 5 for providing a fixed and rigid connection between the elongate element 1 and the component 5. In the projecting portion 9 which is formed by the leg portions 11 and the top portion 13 of the elongate element the latter is not in contact with the component 5.

Figure 2:
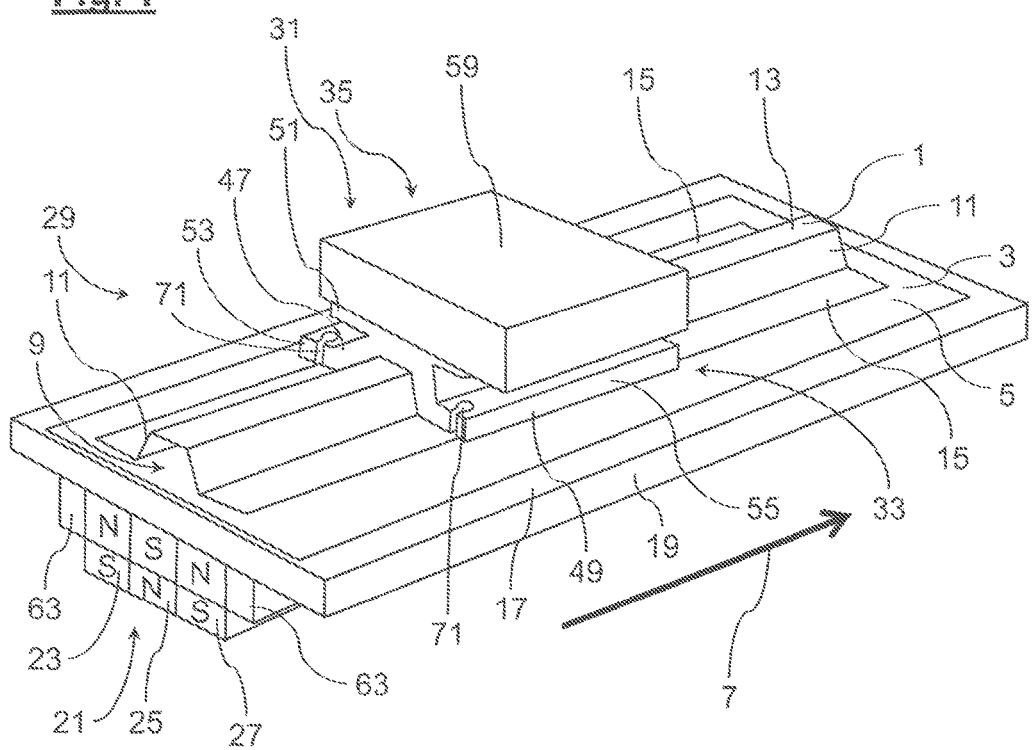
FIG. 2 shows perspective view of an exemplary embodiment of a system according to the present disclosure comprising a carriage, a plate-shaped support table and a magnetic field generating arrangement.

In FIG. 2 the arrangement of an elongated element 1 arranged on a surface 3 of a component 5 previously described with reference to FIG. 1 is shown on a support surface 17 of a plate-shaped support element 19 in form of a support table. Underneath the plate-shaped support element 19, i.e., on the opposite side of the support surface 17, a magnetic field generating arrangement 21 has been disposed. The magnetic field generating arrangement 21 is formed by three permanent magnets 23, 25, 27. Each of the permanent magnets 23, 25, 27 has a magnetic north pole designated with letter N and a magnetic south pole designated with letter S. The magnetic north poles N of the two outer permanent magnets 23, 27 face towards the support element 19 and their magnetic south poles S point away from the support element 19. In contrast, the central permanent magnet 25 is disposed between the two outer permanent magnets 23, 27 such that its magnetic north pole N points away from the support element 19 and its magnetic south pole S points towards the support element 19. The three permanent magnets 23, 25, 27 forming the magnetic field generating arrangement 21 extend in the longitudinal direction 7 over the entire length of the support element 19 and generate a predefined and well-known magnetic field. The magnetic fields extends also above the support surface 17 of the support element 19, i.e., to that side of the support element 19 on which the elongate element 1 and the component 5 have been arranged.

The plate-shaped support element 19 and the magnetic field generating arrangement 21 are part of an exemplary embodiment of a system 29 for welding the elongate element 1 along the longitudinal direction 7 to the surface 3 of the component 5. The system 29 further comprises a carriage 31 with a lower support arrangement of support section 33 and an upper guiding section 35. The carriage 31 will now be described in more detail with reference to FIG. 3.

Figure 3:
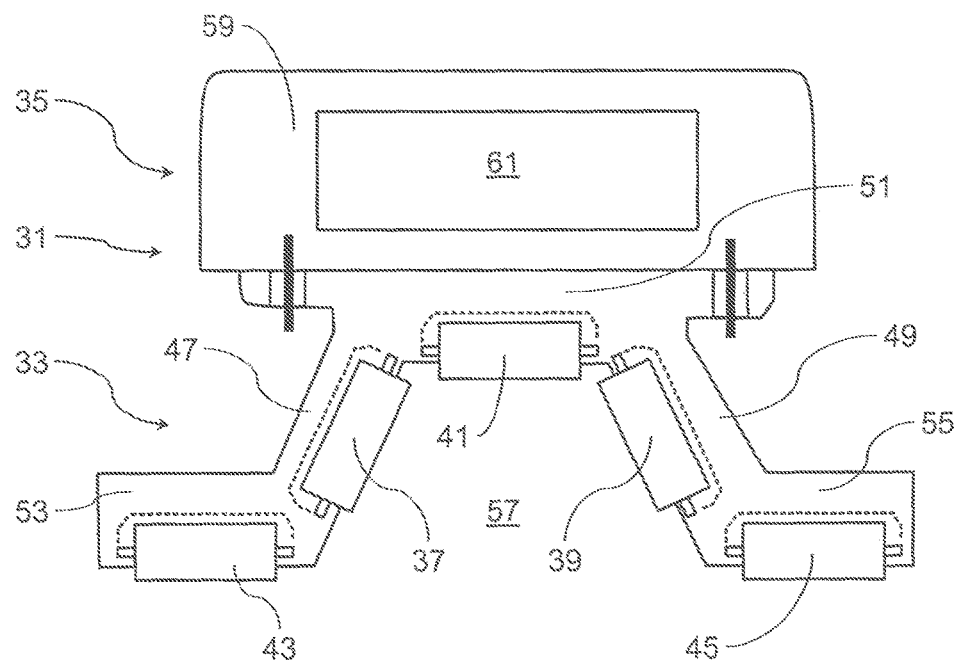
FIG. 3 shows a sectional view of the carriage shown in FIG. 2.

The support section 33 comprises a plurality of first, second, and third contacts arranged in multiple sets in the longitudinal direction 7. In FIG. 3 one of the sets of contacts comprising a first contact 37, a second contact 39 and three third contacts 41, 43, 45 is shown. All contacts 37, 39, 41, 43, 45 are rotatably mounted rollers which are adjustable for adapting the carriage 31 to various cross-sectional shapes of elongate elements 1. In addition, the contacts 37, 39, 41, 43, 45 are suspended on springs to allow further adaptation to different cross-sectional shapes. The first and the second contacts 37, 39 are mounted spaced from one another on leg sections 47, 49 of the support section 33 of the carriage 31. The leg sections 47, 49 are connected by a top section 51 which also forms a base on which the upper guiding arrangement or guiding section 35 of the carriage 31 is mounted. Further, each of the leg sections 47, 49 terminates in a foot section 53, 55.

When the carriage 31 is arranged on a plate-shaped support element 19 as shown in FIG. 2 the leg sections 47, 49 extend inclined under opposing angles with respect to the support surface 17 of the support element 19. The top section 51 and the two foot sections 53, 55 generally extend parallel to the support surface 17 of the support element 19. Each of the contacts 37, 39, 41, 43, 45 is rotatably attached to the respective section 47, 49, 51, 53, 55 of the carriage 31. Each respective axes of rotation extends generally parallel to the respective section, i.e., the axis of rotation of the first and the second contacts 37, 39 are inclined under opposing angles with respect to the support surface 17 and the axes of rotation of the third contacts 41, 43, 45 extend parallel to the support surface 17.

The first, second and the third contacts 37, 39, 41 which are mounted on the top section 51 of the support section 33 define a reception space 57 between them. In the reception space 57 the projection portion 9 of the suitably shaped elongate element 1 can be received as can be seen in FIG. 2. Note that in FIG. 2 none of the contacts 37, 39, 41, 43, 45 is visible as they are arranged in cavities formed in the support section 33 of the carriage 31. If the projection portion 9 of the suitably shaped elongate element 1 is received in the reception space 57, the first, second and third contacts 37, 39, 41 are all in contact with the elongate element 1. In particular, the first contact 37 is in contact with one of the leg portions 11 of the elongate element 1, the second contact 39 is in contact with the other one of the leg portions 11 of the elongate element 1 and the third contact 41 mounted to the top section is in contact with the top portion 13 of the elongate element 1. As the first and the second contacts 37, 39 are inclined under opposing angles with respect to the support surface 17 of the support element 19 and in contact with respective opposing leg portions 11 of the elongate element 1, they support the elongate element 1 with a lateral force component against movement along the surface 3 of the component 5 in directions perpendicular to the longitudinal direction 7 of the elongate element 1. In other words, the elongate element 1 and the carriage 31 can move relative to one another in the plane of the support surface 17 only in the longitudinal direction 7. The third contacts 41 attached to the top section 51 of the support section 33 can apply a downward force on the top portion 13 of the elongate element 1 pressing the elongate element 1 against the surface 3 to which it is welded. A further pressing downward force is provided by the first and second contacts 37, 39 which are not arranged perpendicularly to the support surface 17 and, therefore, also provide a downward force acting on the leg portions 11 of the elongate element 1.

Additionally, the two further third contacts 43, 45 which are mounted to the opposing foot sections 53, 55 are in contact with the foot portions 15 of the suitably shaped elongate element 1. Like the other third contacts 41, the further third contacts 43, 45 apply a downward force on the elongate element 1 and, in particular, the foot portions 15 of the elongate element 1 pressing these tightly to the surface 3 of the component 5. Thus, while the first and second contacts 37, 39 hold the elongate element in the correct position in the plane of the support surface 17 and perpendicular to the longitudinal direction 7, the third contacts 41, 43, 45 make sure that a tight contact for a robust weld between the elongate element 1 and the surface 3 of the component 5 is provided.

The upper guiding section 35 of the carriage 31 comprises an element cooling device 59 in form of a cryostat and a superconducting element 61. The superconducting element 61 has a defined transition temperature below which the superconducting element exhibits superconductivity. It is fixedly connected to the carriage 31. In the exemplary embodiment shown in FIGS. 2 and 3 the superconducting element 61 is arranged inside the element cooling device 59. The latter can cool the superconducting element 61 below the transition temperature and maintain the superconducting element 61 below the transition temperature. To this end, an external power supply or an external supply of a cooling liquid may be connected to the carriage 31 which is not shown in the Figures.

The predefined magnetic field generated by the magnetic field generating arrangement 21 interacts with the superconducting element 61 once it has been cooled below the defined transition temperature and exhibits superconductivity. Due to the Meissner effect the superconducting element 61 and consequently the entire carriage is held in a well-defined position relative to the magnetic field. As the magnetic field generated by the magnetic field generating arrangement 21 does not change in the longitudinal direction 19, the position is however only well-defined in a direction extending perpendicular to the support surface 17 and a lateral direction extending parallel to the support surface 17 and perpendicular to the longitudinal direction 7. Thus, the interaction of the superconducting element 61 and the defined magnetic field prevents any lateral movement of the carriage 31. In addition, depending on the position above the support surface 17 that is defined by the interaction, the carriage can either levitate or hover above the elongate element 1 or be forced down onto the elongate element. In other words, the downwards force acting on the elongate element 1 can be controlled by the using magnetic field generated by the magnetic field generating arrangement 21. If the carriage 31 hovers above the elongate element 1, the frictional forces between the carriage 31 and the elongate element 1 are minimized. Otherwise, if required, the force pressing the foot portions 15 of the elongate element 1 onto the surface 3 of the component 5 can be increased for an improved welding seam.

In the longitudinal direction 7 the position is not well defined as the magnetic field generated by the field generating arrangement does not change over the length of the field generating arrangement, i.e., in the longitudinal direction 7. Thus, the carriage 31 can be moved in the longitudinal direction 7 on the support surface 17 along a path defined by the magnetic field. For moving the carriage 31 a movement mechanism 63 in form of an arrangement of alternating electromagnets 63 is arranged adjacent both sides of the magnetic field generating arrangement 21 as can be seen FIG. 2. The electromagnets 63 alter the magnetic field generated by the magnetic field generating arrangement 21 such that the position of the superconducting element 61 is also well defined in the longitudinal direction 7. By changing the field created by the electromagnets 63, the well-defined position of the superconducting element 61 can be shifted along the longitudinal direction 7. As the superconducting element 61 and, thus, the entire carriage 31 always moves to the well-defined position and the well-defined position can only be changed in the longitudinal direction 7, the electromagnets 63 provide a way for linearly moving the carriage 31 along the longitudinal direction 7, i.e., they provide a linear motor.

Figure 4:
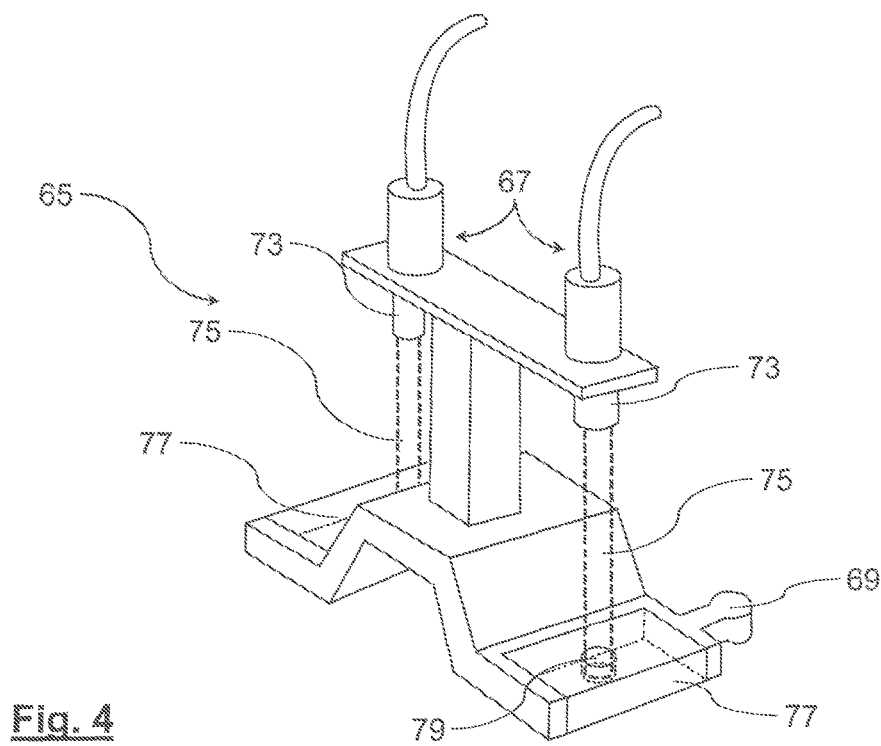
FIG. 4 shows a perspective view of a welding unit comprising a welding device for the exemplary embodiment of a system according to the present disclosure shown in FIG. 2.

FIG. 4 shows a welding unit 65 in form of a welding unit carriage 65 supporting a welding device 67. The welding unit 65 is provided with two male connectors 69 (only one is shown in FIG. 4) for releasably connecting the welding unit 65 to the carriage 31. As can be seen in FIG. 2, the carriage 3 comprises mating female connector 71. As the welding unit 65 has a similar cross-sectional shape as the support section 33 of the carriage 31 details will be omitted for the sake of brevity. Like the carriage 31, the welding unit 65 may comprise rotatable contacts in the form of rollers or balls for reducing the friction between the welding unit 65 and the elongate element 1.

The welding device 67, which is only partially shown in FIG. 4, is formed as a laser through welding device 67 comprising two laser sources 73 emitting laser beams 75 for welding the foot portions 15 of the elongate element 1 to the surface 3 of the component 5. The welding unit 65 comprises inserts 77 which are transparent for the laser beams 75 such that the laser beam is not absorbed by the welding unit 65 before it hits the elongate element 1. In the exemplary embodiment shown in FIG. 4, the transparent inserts 77 which can be glass inserts further comprise openings 79 (only one is shown in FIG. 4) such that the laser beams 75 are not obstructed at all by the welding unit 65. In this case, the inserts 77 largely provide a way for visually controlling the result of the welding operation.

If the thickness of the foot portion 15 of the elongate element 1 in a direction extending perpendicular to the surface 3 of the structure 5 exceeds 1 mm, it may be necessary to cool the region of the weld. In this case the transparent inserts 77 can be provided as weld junction cooling devices 81.

Figure 5:
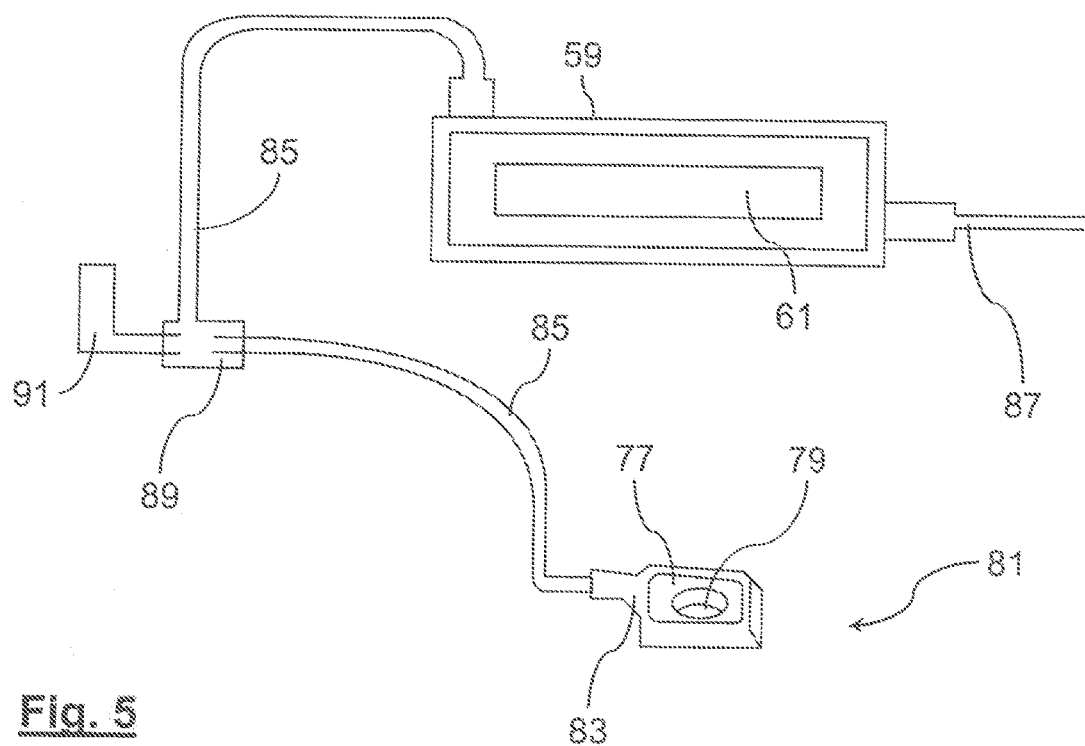
FIG. 5 shows a weld junction cooling device for an exemplary embodiment of a system according to the present disclosure.

An example of a weld junction cooling device 81 will now be described in more detail with reference to FIG. 5. The weld junction cooling device 81 is formed as an active cooling pad 83 surrounding the transparent insert 77 which has an opening 79 for a laser beam. The cooling pad 83 is connected via evaporation tubes 85 to an element cooling device 59 in form of a cryostat 59 which is provided for cooling a superconducting element 61 arranged in the cryostat 59 and used on a carriage 31. Also shown in FIG. 5 is a connection 87 for connecting the cryostat 59 to an external power supply (not shown).

The evaporation tubes 85 are provided for directing evaporated cooling liquid, e.g., liquid nitrogen or helium, from the cryostat 59 to the cooling pad 83. The temperature of the cooling pad 83 can be controlled via a valve 89. The valve 89 can be used to direct evaporated cooling liquid partially or completely to the cooling pad 83 or an exhaust 91. Thus, the cooling pad 83 provides an advantageous means for cooling a weld junction such that thicker materials can be welded using laser trough welding. The cooling pad 83 is particularly advantageous as it uses evaporated cooling liquid from the element cooling device 59 and, therefore, does not require additional power.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a", "an" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A system for welding an elongate element along a longitudinal direction thereof to a surface of a component, wherein the elongate element and the surface each comprise thermoplastic material, the system comprising:
   a support element comprising a support surface adapted to support a component thereon;
   a magnetic field generating arrangement disposed on a side of the support element opposite the support surface and adapted to generate a predefined magnetic field above the support surface;
   a carriage comprising at least one first contact and at least one second contact, wherein the at least one first contact is spaced from the at least one second contact such that the at least one first contact and the at least one second contact are operable to:
      contact an elongate element, which has a suitable cross-sectional shape and is placed on a surface of a component supported on the support element, at spaced locations and thereby support the elongate element against movement along the surface of the component in directions perpendicular to the longitudinal direction of the elongate element; and
      allow movement of the carriage along the longitudinal direction of the elongate element;
   a superconducting element having a defined transition temperature below which the superconducting element exhibits superconductivity and being fixedly connected to the carriage;
   an element cooling device operable to cool and maintain the superconducting element below a transition temperature of the superconducting element;
   a mover operable to linearly move the carriage; and
   at least one welding device operable to weld the elongate element to the surface of the component;
   wherein the predefined magnetic field is configured such that a linear path along the support surface at a distance above the support surface is defined for the superconducting element when the superconducting element has a temperature below the transition temperature, so that the mover is operable to move the carriage along a path corresponding to the defined linear path of the superconducting element.

2. The system according to claim 1, wherein the carriage comprises at least one third contact which is arranged such that, when the elongate element has a suitable cross-sectional shape, the at least one third contact is operable to contact the elongate element and to apply a force to the elongate element having a force component perpendicular to the support surface.

3. The system according to claim 2, wherein each of the at least one third contact comprises a rotatably mounted roller or ball.

4. The system according to claim 2, wherein each of the at least one third contact is mounted such that its position is adjustable and/or such that it is spring mounted to allow adaptation to various cross-sectional shapes of the elongate element.

5. The system according to claim 1, wherein the at least one first contact and the at least one second contact are arranged such that a reception space is defined between them, so that, when the elongate element has a suitable cross-sectional shape including a projecting portion extending along the longitudinal direction of the elongate element, the projecting portion is receivable in the reception space with the at least one first contact and the at least one second contact in contact with the projecting portion.

6. The system according to claim 5, wherein the at least one first contact and the at least one second contact are arranged such that each of them is operable to apply a force to the projecting portion having a force component perpendicular to the support surface.

7. The system according to claim 1, wherein the at least one welding device is provided on a welding unit, which is a component separate from the carriage, wherein the welding unit and the carriage comprise cooperating connectors operable to releasably couple the welding unit to the carriage.

8. The system according to claim 7, wherein the carriage is a positioning carriage and the welding unit comprises a welding unit carriage, wherein upon coupling the welding unit to the positioning carriage and moving the positioning carriage by the mover the welding unit carriage is pulled or pushed by the positioning carriage.

9. The system according to claim 1, wherein the carriage or the at least one welding device comprises at least one weld junction cooling device adapted to cool a weld junction created by the at least one welding device.

10. The system according to claim 9, wherein the at least one weld junction cooling device is connected to the element cooling device and the element cooling device is adapted to cool the weld junction cooling device.

11. The system according to claim 1, wherein each of the at least one first contact and/or each of the at least one second contact comprises a rotatably mounted roller or ball.

12. The system according to claim 1, wherein each of the at least one first contact and/or each of the at least one second contact is mounted such that a position of the at least one first contact and/or at least one second contact is adjustable and/or such that the at least one first contact and/or at least one second contact is spring mounted to allow adaptation to various cross-sectional shapes of the elongate element.

13. The system according to claim 1, wherein the at least one welding device is adapted to carry out laser welding, laser through welding, ultrasonic welding or induction welding.

* * * * *